(12) United States Patent
Shakuda

(10) Patent No.: US 7,977,703 B2
(45) Date of Patent: Jul. 12, 2011

(54) NITRIDE SEMICONDUCTOR DEVICE HAVING A ZINC-BASED SUBSTRATE

(75) Inventor: Yukio Shakuda, Kyoto (JP)

(73) Assignee: Rohm Co., Ltd., Kyoto-Shi (JP)

( * ) Notice: Subject to any disclaimer, the term of this patent is extended or adjusted under 35 U.S.C. 154(b) by 299 days.

(21) Appl. No.: 12/085,327

(22) PCT Filed: Nov. 21, 2006

(86) PCT No.: PCT/JP2006/323176
§ 371 (c)(1),
(2), (4) Date: May 21, 2008

(87) PCT Pub. No.: WO2007/060931
PCT Pub. Date: May 31, 2007

(65) Prior Publication Data
US 2009/0283782 A1    Nov. 19, 2009

(30) Foreign Application Priority Data

Nov. 22, 2005  (JP) .................................. 2005-337484
Nov. 22, 2005  (JP) .................................. 2005-337806

(51) Int. Cl.
| H01L 29/24 | (2006.01) |
| H01L 33/00 | (2010.01) |
| H01L 29/06 | (2006.01) |
| H01L 31/0328 | (2006.01) |
| H01L 31/0336 | (2006.01) |
| H01L 31/072 | (2006.01) |
| H01L 31/109 | (2006.01) |
| H01L 29/205 | (2006.01) |
| H01L 29/22 | (2006.01) |

(52) U.S. Cl. ............ 257/103; 257/13; 257/21; 257/91; 257/94; 257/E33.025; 257/E33.028; 257/E33.03; 257/E33.033; 257/E33.034

(58) Field of Classification Search ............. 257/13, 257/21, 94, 103, E33.025, E33.028, E33.03, 257/E33.033, E33.034, 91
See application file for complete search history.

(56) References Cited

U.S. PATENT DOCUMENTS

| 5,932,327 A | * | 8/1999 | Inoguchi et al. | ............. 428/212 |
| 6,015,979 A | * | 1/2000 | Sugiura et al. | ................. 257/86 |
| 6,147,364 A | * | 11/2000 | Itaya et al. | ..................... 257/76 |

(Continued)

FOREIGN PATENT DOCUMENTS

JP    06-061527    3/1994

(Continued)

*Primary Examiner* — Ida M Soward
(74) *Attorney, Agent, or Firm* — Rabin & Berdo, P.C.

(57) ABSTRACT

A nitride semiconductor device includes a semiconductor substrate; a first nitride semiconductor layer provided on the semiconductor substrate; a mask layer having opening portions, provided on the first nitride semiconductor layer; a second nitride semiconductor layer selectively grown on the mask layer laterally from the opening portions; and a semiconductor lamination portion formed by laminating nitride semiconductor layers so as to form a semiconductor element on the second nitride semiconductor layer. The substrate may be made of a zinc-based compound, the first nitride semiconductor layer may be provided on, and in contact with, the substrate, and at least a substrate side of the first nitride semiconductor layer may be made of $Al_yGa_{1-y}N$ ($0.05 \leq y \leq 0.2$). Additionally, the semiconductor element may be a light emitting layer in which case the mask layer may include a metal film provided on the first nitride semiconductor layer and an insulating film provided on the metal film.

13 Claims, 6 Drawing Sheets

U.S. PATENT DOCUMENTS

| | | |
|---|---|---|
| 6,252,261 B1 | 6/2001 | Usui et al. |
| 6,312,967 B1 * | 11/2001 | Ikeda ................................ 438/22 |
| 6,475,882 B1 * | 11/2002 | Sakai et al. ..................... 438/483 |
| 6,549,552 B1 * | 4/2003 | Omi et al. ................... 372/45.01 |
| 6,566,231 B2 * | 5/2003 | Ogawa et al. .................. 438/448 |
| 6,627,520 B2 * | 9/2003 | Kozaki et al. .................. 438/479 |
| 6,711,192 B1 * | 3/2004 | Chikuma et al. ........... 372/43.01 |
| 6,765,233 B2 * | 7/2004 | Tsuda et al. ..................... 257/80 |
| 6,784,462 B2 * | 8/2004 | Schubert ......................... 257/98 |
| 6,821,804 B2 * | 11/2004 | Thibeault et al. ................ 438/29 |
| 6,838,704 B2 * | 1/2005 | Lin et al. ......................... 257/98 |
| 6,849,864 B2 * | 2/2005 | Nagahama et al. .............. 257/22 |
| 6,863,943 B2 * | 3/2005 | Wang et al. ..................... 428/37 |
| 6,891,268 B2 * | 5/2005 | Tomiya et al. ................. 257/744 |
| 7,049,635 B2 * | 5/2006 | Sano et al. ....................... 257/79 |
| 7,053,420 B2 * | 5/2006 | Tadatomo et al. ............... 257/98 |
| 7,102,174 B2 * | 9/2006 | Hideyoshi et al. ............... 257/94 |
| 7,148,514 B2 * | 12/2006 | Seo et al. ......................... 257/79 |
| 7,170,097 B2 * | 1/2007 | Edmond et al. .................. 257/77 |
| 7,187,007 B2 * | 3/2007 | Kim et al. ........................ 257/79 |
| 7,279,751 B2 * | 10/2007 | Ueda et al. ..................... 257/347 |
| 7,442,254 B2 * | 10/2008 | Kiyoku et al. ................... 117/95 |
| 7,646,027 B2 * | 1/2010 | Bandoh ............................ 257/79 |
| 2002/0001864 A1 * | 1/2002 | Ishikawa et al. ................. 438/22 |
| 2002/0057053 A1 * | 5/2002 | Hitoshi ........................... 313/505 |
| 2002/0066403 A1 | 6/2002 | Sunakawa et al. |
| 2003/0234404 A1 * | 12/2003 | Matsuoka et al. ............. 257/103 |
| 2003/0235226 A1 * | 12/2003 | Ueki ................................ 372/46 |
| 2005/0145840 A1 * | 7/2005 | Kato et al. ....................... 257/43 |
| 2006/0273339 A1 * | 12/2006 | Steigerwald et al. ............ 257/99 |
| 2007/0241352 A1 * | 10/2007 | Yasuda et al. ................... 257/94 |
| 2007/0295981 A1 * | 12/2007 | Erchak et al. ................... 257/98 |
| 2008/0048194 A1 * | 2/2008 | Kudo et al. ...................... 257/94 |
| 2008/0230780 A1 * | 9/2008 | Urashima ........................ 257/51 |

FOREIGN PATENT DOCUMENTS

| | | |
|---|---|---|
| JP | 10-173222 | 6/1998 |
| JP | 2003-174228 | 6/2003 |
| JP | 2005-236260 | 9/2005 |
| JP | 2005-305596 | 5/2007 |

* cited by examiner

F I G. 7
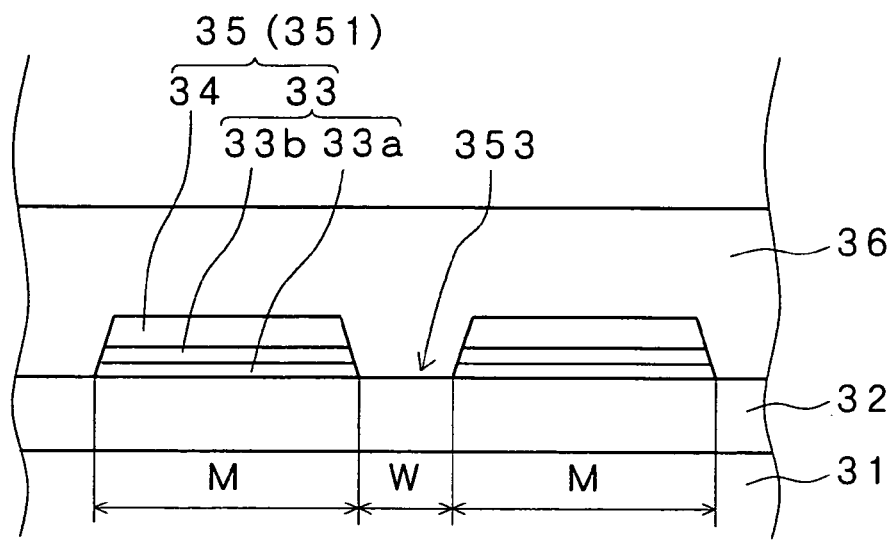
F I G. 8
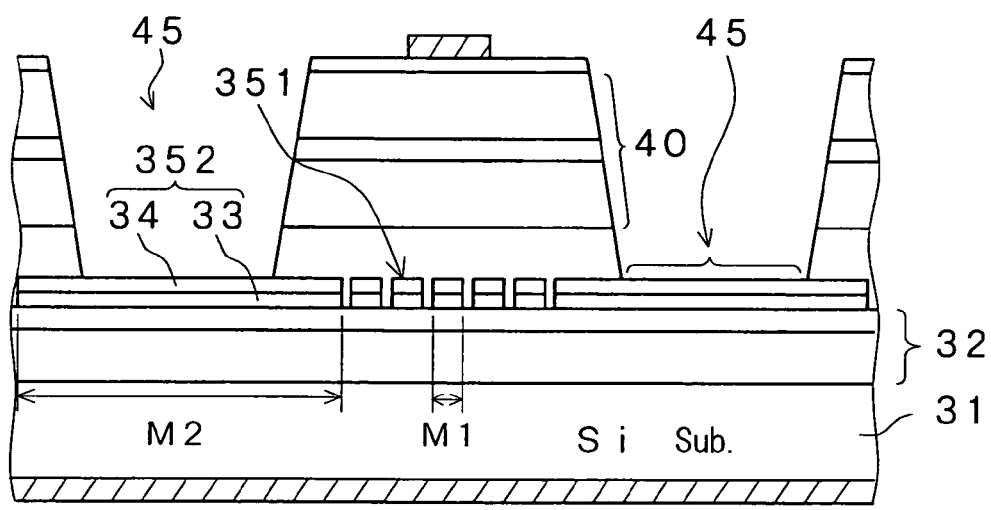

(a)

(b)

US 7,977,703 B2

NITRIDE SEMICONDUCTOR DEVICE HAVING A ZINC-BASED SUBSTRATE

FIELD OF THE INVENTION

The present invention relates to a semiconductor device using nitride semiconductor crystal layers, such as a semiconductor light emitting device like a light emitting diode (LED), a laser diode (LD) or the like, or a transistor device like a HEMT or the like, using nitride semiconductor. More particularly, the present invention relates to a nitride semiconductor light emitting device with excellent crystallinity and high external quantum efficiency even when light emitted in a light emitting layer is absorbed by using an electric conductive semiconductor substrate, and relates to a nitride semiconductor device in which nitride semiconductor layers with excellent crystallinity are grown by using an electric conductive ZnO based compound for a substrate, and by preventing a surface of a substrate from being roughened by etching the substrate with a raw material of group V element for growing the nitride semiconductor layers, while using a MOCVD (metal organic chemical vapor deposition) method which makes mass production easy.

BACKGROUND OF THE INVENTION

In recent years, nitride semiconductor light emitting devices such as a blue light emitting diode (LED), a laser diode (LD) or the like, using nitride semiconductor, have been in practical use. As shown, for example, in FIG. 9(a), the LED emitting blue light using nitride semiconductor is formed by laminating, a low temperature buffer layer 52 made of GaN or the like, and a semiconductor lamination portion 56 which includes an n-type layer 53 made of GaN or the like, an active layer (light emitting layer) 54 made of, for example, InGaN based (which means that a ratio of In to Ga can be varied variously and the same applies hereinafter) compound semiconductor which has a smaller band gap energy than that of the n-type layer 53 and decides a wavelength of emitted light, and a p-type layer 55 made of GaN or the like on a sapphire substrate 51 by the MOCVD method. And a p-side electrode 58 is provided on a surface thereof interposing a light transmitting conductive layer 57 and an n-side electrode 59 is provided on a surface of the n-type layer 53 exposed by etching a part of the semiconductor lamination portion 56. In this case, a semiconductor layer having still larger band gap energy such as an AlGaN based (which means that a ratio of Al to Ga can be varied variously and the same applies hereinafter) compound or the like may be used on the active layer side of the n-type layer 53 and the p-type layer 55 in order to increase an effect of carrier confinement (cf. for example PATENT DOCUMENT 1).

However, since an electrode can not be formed directly on the substrate because the sapphire substrate 51 is an insulating substrate, it is necessary, as described above, to form a mesa structure by a process such as etching a part of the semiconductor lamination portion 56 or the like, then a vertical type device in which a pair of electrodes is formed on both sides of a chip can not be obtained. In addition, since lattice constants of sapphire and nitride semiconductor materials are very different from each other, dislocation density increases by lattice mismatching, a semiconductor device with high quality can be hardly obtained. Furthermore, thermal conductivity of the sapphire substrate 51 is lower comparing with a substrate made of GaAs, GaP, Si or the like which is conventionally used for a conductive substrate of a red or infrared semiconductor light emitting device, or a SiC substrate or the like which is used for a blue semiconductor light emitting device. Then, there is suggested an idea of a structure in which a nitride semiconductor light emitting device is formed by using such semiconductor substrates in place of the sapphire substrate.

More concretely, as shown in FIG. 9(b), the nitride semiconductor light emitting device is formed by laminating a buffer layer 62 made of AlGaN based compound or the like, and a semiconductor lamination portion 66 formed by laminating an n-type layer 63, an active layer (light emitting layer) 64, and a p-type layer 65, on a Si substrate 61 by a MOCVD method, and by providing a p-side electrode 68 on a surface thereof interposing a light transmitting conductive layer 67, and an n-side electrode 69 directly on a back surface of the Si substrate 61.

PATENT DOCUMENT 1: Japanese Patent Application Laid-Open No. H10-173222 (cf. FIG. 1)

DISCLOSURE OF THE INVENTION

Problem to be Solved by the Present Invention

As described above, by forming a nitride semiconductor light emitting device directly on the substrate made of GaAs, GaP, Si, SiC or the like in place of sapphire, a vertical type device in which a pair of electrodes is formed on both sides of a chip can be produced, and light emitting efficiency under a high temperature and high output can be improved because the substrate has a thermal conductivity higher than that of the sapphire substrate.

However, since a wavelength of light emitted by a nitride semiconductor light emitting device is in a range from yellow to ultraviolet light, when light emitted in the light emitting layer of the semiconductor lamination portion travels to a direction of the substrate and reaches the substrate, if the above-described substrate is used, the light is absorbed at the substrate, and there arises a problem such that a light emitting device with high efficiency of taking out light can not be formed. In addition, if a substrate made of the above-described materials is used, because difference of a lattice constant between the substrate and those of nitride semiconductor layers laminated thereon is large, a dislocation density in the nitride semiconductor layers on the substrate is high, then, there also arises a problem such that an efficiency of light emitting can not be improved.

On the other hand, there is an idea such that absorption of light at the substrate is prevented by using a silicide substrate which is formed by vapor deposition of W or the like, for example on a Si substrate. However, even in such case, since a reflection coefficient at a silicide portion is not so high, light transmits to the substrate side, and light is absorbed at the substrate after all, then efficiency of taking out light can not be enhanced. In addition, even if the substrate made of silicide is formed by using W, since the substrate reacts with ammonia gas which is a raw material for a GaN based compound laminated thereon, at the time of MOCVD growth, and an impurity layer is formed at an interface between the silicide and an AlGaN based compound layer, crystallinity of a light emitting layer laminated thereon deteriorates, the efficiency of taking out light is lowered.

Then, a structure using a ZnO substrate which can be formed so as to have a lattice constant similar to that of a nitride semiconductor material and electric conductivity may be suggested in place of using a sapphire substrate. However, when it is intended to use a ZnO substrate and grow a nitride semiconductor lamination portion thereon by using a MOCVD apparatus, the nitride semiconductor lamination portion is usually grown at a high temperature of, concretely, 1,000° C. or more by using an organic metal for a raw material of group III element and ammonia gas for a raw material of group V element. However, the ammonia gas has a function of etching a surface of the ZnO substrate under a high temperature condition, therefore the surface of the ZnO substrate is roughened by the ammonia gas just before growing the nitride semiconductor lamination portion on the ZnO substrate, and there occasionally occurs deterioration of crystallinity of the nitride semiconductor lamination portion grown thereon, or film separation between the nitride semiconductor lamination portion and the substrate. On the other hand, in order to inhibit the above described problem, there is an idea such that the nitride semiconductor lamination portion is formed at an extremely low temperature of, concretely, 600° C. or less for preventing the surface from being roughened, however, in a low temperature growth, since crystal axes are not orientated in the same direction and crystallinity deteriorates, crystal defects are generated in the nitride semiconductor lamination portion and light emitted in a light emitting layer is absorbed, and also since an invasion rate of impurities into films increases, electric resistances of the films grown become high. In such manner, if the nitride semiconductor lamination portion is grown on a ZnO substrate by the MOCVD method, nitride semiconductor layers with excellent quality can not be obtained in both cases of a high temperature and a low temperature.

The present invention is directed to solve the above-described problems and an object of the present invention is to provide a nitride semiconductor device with low leakage current and high characteristics in which, while a zinc oxide based compound such as $Mg_xZn_{1-x}O$ ($0 \leqq x \leqq 0.5$) is used for a substrate, crystallinity of nitride semiconductor grown thereon by a MOCVD method which is superior in mass production is improved and film separation and cracks are prevented.

Another object of the present invention is to provide a nitride semiconductor light emitting device having high luminous efficiency, by using a semiconductor substrate enable to produce a vertical type device in which a pair of electrodes is formed on both sides of a chip, enable to prevent light absorption by the substrate while maintaining high thermal conductivity, and also enable to reduce dislocation density of a nitride semiconductor layer grown on the substrate.

Still another object of the present invention is to provide a semiconductor light emitting device such as a LED, a LD or the like having a structure capable of improving light emitting characteristics such as external quantum efficiency by laminating nitride semiconductor layers while using a zinc oxide based compound such as $Mg_xZn_{1-x}O$ ($0 \leqq x \leqq 0.5$) for a substrate.

Means for Solving the Problem

The present inventor studied earnestly and repeatedly for growing nitride semiconductor layers on a ZnO based compound substrate by a MOCVD method, and, as a result, found together with other inventors and disclosed in PATENT APPLICATION NO. 2005-305596 that by carrying out controlling a temperature during growth, controlling a ratio of flow rates of raw gasses for growth, specifying a principal plane of the ZnO based compound substrate on which the nitride semiconductor layers are grown, growing an AlGaN based compound layer containing Al on a surface of the substrate, or the like, the nitride semiconductor layers can be grown without roughening the surface of the ZnO based compound substrate so much, and after covering the surface of the ZnO based compound substrate with the nitride semiconductor layers, even if a temperature of the substrate is raised, the substrate can be prevented from being roughened by ammonia gas. However, if a first nitride semiconductor layer is thin, when a temperature is raised to a high temperature of approximately 1,000° C. for growing a nitride semiconductor layer with high quality, ammonia gas invades a substrate side, then the substrate is roughened and crystallinity of the first nitride semiconductor layer deteriorates. In addition, if the first nitride semiconductor layer is thick, a period for growing the first nitride semiconductor layer becomes long depending on variations of process parameters, thereby the surface is occasionally roughened, and also separation from the substrate occasionally occurs which is caused by difference of thermal expansion between the nitride semiconductor layer and the ZnO based compound substrate.

Then, as a result of further earnest and repeated studies, the present inventor found that conditions of forming a first nitride semiconductor layer firstly provided on a ZnO based compound substrate are set so that the ZnO based compound is not invaded by ammonia gas with the above conditions, the layer is formed with a thin layer of a thickness in which the ZnO based compound substrate is not influenced even if the conditions are varied to some extent, and a mask layer is formed thereon which is made with a dielectric film having opening portions, thereby even if a GaN based compound layer is formed at a high temperature thereafter, epitaxial growth is carried out laterally on the mask layer from the opening portions, and, as a result, a nitride semiconductor layer with excellent crystallinity can be grown. Namely, since the dielectric film made of $SiO_2$ or the like for the mask layer can be formed at a low temperature, the ZnO based compound substrate is not influenced at all, and whole region except the opening portions can be covered. And, at the opening portions, the ZnO based compound substrate is covered with the first nitride semiconductor layer, and an area of each of the opening portions is very small, then the ZnO based compound substrate is hardly roughened even when exposed to an atmosphere of ammonia gas at a high temperature of 1,000° C. or more.

Here, the zinc oxide (ZnO) based compound semiconductor means an oxide including Zn, and means concretely besides ZnO, an oxide of one or more elements of group IIA and Zn, an oxide of one or more elements of group IIB and Zn, or an oxide of elements of group IIA and group II B and Zn. And, the nitride semiconductor means a compound of Ga of group III element and N of group V element or a compound (nitride) in which a part or all of Ga of group III element substituted by other element of group III element like Al, In or the like and/or a part of N of group V element substituted by other element of group V element like P, As or the like, and is referred to as GaN based compound. In addition, a zinc oxide based compound, for example $Mg_xZn_{1-x}O$, has a hexagonal crystal structure as its schematic perspective view is shown in FIG. 5, a C plane is a (0001) plane of a Zn polarity plane and a (000-1) plane of an O polarity plane, as shown in FIG. 5, and any of them is a plane orthogonal to an A plane {11-20} and an M plane {10-10}. In addition, (000-1), (11-20), (10-10), {11-20} and {10-10} mean strictly (000$\bar{1}$), (11$\bar{2}$0), (10$\bar{1}$0), {11$\bar{2}$0} and {10$\bar{1}$0}, however, an abbreviated notation is used as described above in convenience. In addition, for example, a {11-20} plane means a general term meaning including planes equivalent to a (11-20) plane by symmetricity of crystals.

A nitride semiconductor device according to the present invention includes: a substrate made of a zinc oxide based compound; a first nitride semiconductor layer provided on the substrate; a mask layer having opening portions, provided on the first nitride semiconductor layer; a second nitride semiconductor layer selectively grown on the mask layer laterally from the opening portions; and a semiconductor lamination portion formed by laminating nitride semiconductor layers so as to form a semiconductor element on the second nitride semiconductor layer.

Concretely, by forming the first nitride semiconductor layer at a substrate temperature of 600 to 800° C. by a MOCVD method and with a thickness of 500 to 8,000 Angstroms, the first nitride semiconductor layer with good quality is obtained, and since the first nitride semiconductor layer is protected with the mask layer on a surface thereof, the substrate is protected to growth at a high temperature and the first nitride semiconductor layer excellent for seeds can be exposed at the opening portions.

It is preferable that at least a substrate side of the first nitride semiconductor layer is made of $Al_yGa_{1-y}N$ ($0.05 \leq y \leq 0.2$), from the viewpoint of preventing more a surface of the ZnO substrate from being roughened, as described above. Further, it is preferable that a principal plane of the substrate is a (0001) plane and Zn polarity plane, also from the viewpoint of preventing more a surface of the ZnO substrate from being roughened, as described above.

Concretely, an n-type layer, an active layer and a p-type layer are laminated on the second nitride semiconductor layer so as to form a light emitting layer, thereby a semiconductor light emitting device is formed.

Another embodiment of a nitride semiconductor light emitting device according to the present invention includes: a semiconductor substrate; a first nitride semiconductor layer provided on the semiconductor substrate; a mask layer having opening portions, provided on the first nitride semiconductor layer; a second nitride semiconductor layer selectively grown on the mask layer laterally from the opening portions; and a semiconductor lamination portion formed by laminating nitride semiconductor layers so as to form a light emitting layer on the second nitride semiconductor layer, wherein the mask layer includes a metal film provided on the first nitride semiconductor layer and an insulating film provided on the metal film.

In addition, it is preferable that the metal film is formed with at least double layer structure of a first metal film provided on the first nitride semiconductor layer and a second metal film provided on the first metal film, and the first metal film is made of a metal which has a melting temperature higher than a growth temperature of the semiconductor lamination portion and the second metal film is made of a metal which reflects light emitted in the light emitting layer.

Concretely, the metal film may be used which is formed with the first metal film made of at least one of W, Ti and Pd, and the second metal film made of at least one of Al, Ag and Au.

EFFECT OF THE INVENTION

By the nitride semiconductor device according to the present invention, since the first nitride semiconductor layer and the mask layer having opening portions are laminated on the substrate made of a ZnO based compound such as $Mg_xZn_{1-x}O$ or the like and the second nitride semiconductor layer is selectively grown on the mask layer laterally from the opening portions using the first nitride semiconductor layer as seeds, even if the first nitride semiconductor layer is thin, the ZnO based compound substrate is covered with the mask layer made of $SiO_2$ or the like, then even if the layers are exposed to an ammonia gas atmosphere of a high temperature for growing at high temperature, the substrate can not be eroded. Furthermore, since, by providing the mask layer, the first nitride semiconductor layer grown directly on the ZnO based compound substrate can be formed thin, a period of being exposed to the ammonia gas atmosphere can be shortened, then, as described above, by carrying out controlling a temperature during growth, controlling a ratio of flow rates of raw gasses for growth, specifying a principal plane of the ZnO based compound substrate on which the nitride semiconductor layers are grown, growing an AlGaN based compound layer containing Al on a surface of the substrate, or the like, the substrate is prevented from being roughened perfectly and the first nitride semiconductor layer with excellent crystallinity can be grown.

As a result, even if the substrate is exposed to an ammonia atmosphere at a high temperature of 1,000° C. or more in order to grow the second nitride semiconductor layer with excellent crystallinity, since the substrate is never eroded, and, additionally the second nitride semiconductor layer can be grown laterally on the mask layer using the first nitride semiconductor layer with excellent crystallinity as seeds, the second nitride semiconductor layer is also formed in a semiconductor layer with excellent crystallinity, and, furthermore, the nitride semiconductor layers further laminated thereon can be also formed with very excellent crystallinity. As a result, since, in the nitride semiconductor layers laminated on the second nitride semiconductor layer, light is not absorbed and films with excellent crystallinity in which crystal axes are orientated in the same direction can be formed, thereby useless impurities in the films decrease and the films of a low electric resistance with high carrier density and electron mobility can be formed. Then, even when a LED, a LD or the like is formed, a semiconductor light emitting device with excellent characteristics having a low operation voltage, high internal quantum efficiency, and a low threshold current can be obtained as a vertical type device in which a pair of electrodes is taken out from upper and down sides of a chip, and when a transistor or the like is formed, a transistor (HEMT) with a high speed having a small leakage current and a high withstand voltage can be obtained. In addition, by increasing a mixed crystal ratio of Mg of the substrate, band gap energy is increased, and light with a short wavelength such as ultraviolet light or the like is not absorbed.

In addition, by the nitride semiconductor light emitting device according to the present invention using other semiconductor substrate, even in case of using a semiconductor substrate which absorbs blue or ultraviolet light such as a substrate made of GaAs, GaP, SiC or the like, since a metal film which is easy to reflect light is formed under the insulating film, the light generated in a light emitting layer is reflected by the metal film, the light is prevented from reaching the substrate, and absorption of the light at the substrate is inhibited, thereby a semiconductor light emitting device capable of enhancing efficiency of taking out light can be obtained. And, for increasing of dislocation density caused by lattice mismatching, since the second nitride semiconductor layer is formed by lateral selective growth by using a mask layer having opening portions and using the first nitride semiconductor layer exposed at opening portions as seeds, penetrating dislocations are inhibited by the mask layer, and a layer with less dislocations and high crystallinity can be obtained. As a result, also in a light emitting layer laminated thereon, dislocations decreases, a problem of lattice mismatching is solved, and the light emitting layer with small dislocation density and high quality can be formed. In addition, since the substrate is made of semiconductor, a conductive substrate can be formed by doping, then, in case of forming LED, it is not necessary to form a mesa structure, and a vertical type device in which a pair of electrodes is formed at upper and down sides of a chip can be obtained, and since the thermal conductivity of the semiconductor is higher than that of the sapphire, the thermal saturation is inhibited up to a high temperature and high output, thereby a semiconductor device with high light emitting efficiency can be obtained.

In addition, by forming the metal film with a two layer structure of a first metal film made of a metal which reflects light generated in a light emitting layer, and a second metal film made of a metal which has a melting point higher than a growth temperature of a semiconductor lamination portion, the metal of the first metal film can be prevented from diffusing into semiconductor layers, therefore, characteristics of the device is not deteriorated, and absorption of light at the substrate can be inhibited sufficiently, and, as a result, a semiconductor light emitting device with higher light emitting efficiency can be obtained.

BRIEF DESCRIPTION OF THE DRAWINGS

FIG. 7 is an enlarged explanatory cross-sectional view of a vicinity of a mask layer by an example shown in FIG. 6.

FIG. 8 is an explanatory cross-sectional view of the nitride semiconductor device by the example shown in FIG. 6 before elements are divided.

EXPLANATION OF LETTERS AND NUMERALS

Figure 1A:
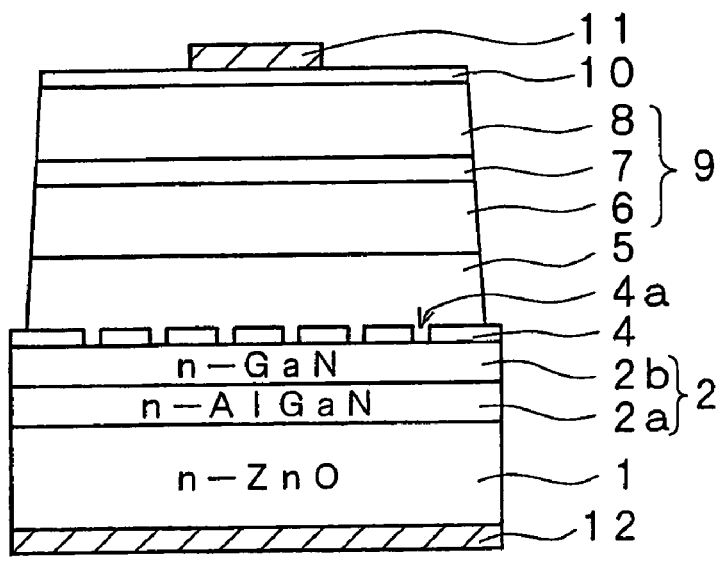
FIG. 1A is an explanatory cross-sectional view of a LED which is an embodiment of the nitride semiconductor device according to the present invention.

1: ZnO substrate
2: first nitride semiconductor layer
4: mask layer
5: second nitride semiconductor layer
9: semiconductor lamination portion
31: semiconductor substrate
32: first nitride semiconductor layer
33: metal film
34: insulating film
35: mask layer
36: second nitride semiconductor layer
40: semiconductor lamination portion

THE BEST EMBODIMENT OF THE PRESENT INVENTION

An explanation will be given below of a nitride semiconductor device according to the present invention in which a ZnO based compound substrate is used as a substrate in reference to the drawings. As an explanatory cross-sectional view of a nitride semiconductor light emitting device (LED chip) of an embodiment is shown in FIG. 1A, the nitride semiconductor device according to the present invention is formed such that a substrate 1 is made of a zinc oxide based compound such as $Mg_xZn_{1-x}O$ ($0 \leqq x \leqq 0.5$), a first nitride semiconductor layer 2 is provided on the substrate 1, a mask layer 4 having opening portions 4a and a second nitride semiconductor layer 5 selectively grown laterally from the opening portions 4a are formed on the first nitride semiconductor layer 2, and nitride semiconductor layers 6 to 8 are laminated on the second nitride semiconductor layer 5 so as to form a semiconductor element (so as to form a light emitting layer of a LED in the example shown in FIG. 1A). In addition, in the example shown in FIG. 1A, the first nitride semiconductor layer 2 is formed by a first layer 2a made of AlGaN based compound provided at a substrate 1 side and a second layer 2b made of GaN provided at an upper side, and, although a plurality of layers are used in this case, single layer may be used. In addition, substrates in all figures including FIG. 1A, are drawn thin comparing to other semiconductor layers, however, actually, a thickness of the substrate 1 is much larger than that of each semiconductor layer.

Namely, the present invention is characterized in using a substrate made of a zinc oxide based compound such as $Mg_xZn_{1-x}O$ or the like as a substrate 1, and providing the first nitride semiconductor layer 2 directly on a surface of the substrate, the mask layer 4 having opening portions on the first nitride semiconductor layer 2, and the second nitride semiconductor layer 5 epitaxially grown laterally on the mask layer 4, in order to laminate nitride semiconductor layers by a MOCVD method. As described above, when the nitride semiconductor layers are grown by the MOCVD method, it is preferable to grow at a temperature of approximately 1,000° C. or more because high quality of a GaN film can be obtained at a high growth temperature, however, if a ZnO based compound substrate is used as the substrate 1, the ZnO substrate is etched by ammonia gas, a surface of the substrate 1 where epitaxial growth is carried out is roughened, and the nitride semiconductor layers with high quality of a film can not be grown. On the other hand, when the growing is carried out at a low temperature of 600° C. or less in order to prevent the above-described problem, quality of a film of GaN deteriorates, and there arises a problem such as deterioration of crystallinity of the nitride semiconductor layers.

However, the present inventor discovered, as a result of earnest and repeated studies as described above, that, by growing a thin first nitride semiconductor layer 2 while controlling a temperature or the like so as to prevent a ZnO based compound substrate from being roughened, and forming the mask layer 4 having opening portions with a dielectric film made of $SiO_2$ or the like, the substrate is protected by the mask layer 4, then, even under an ammonia atmosphere of a high temperature, the ZnO based compound substrate can be prevented from being roughened, and by growing the second nitride semiconductor layer epitaxially grown laterally on the mask layer 4 at a high temperature thereafter, a nitride semiconductor device with excellent crystallinity can be formed. Namely, by adopting such manner, it was found that there are solved the problem such as roughness of the substrate caused by variation of process parameters generated when increasing a thickness of the first nitride semiconductor layer 2, or occurrence of cracks depending on a difference of the thermal expansion between the nitride semiconductor layer and the substrate 1, because although the mask layer 4 has the opening portions, most area of a surface of the substrate 1 is covered by the mask layer 4, and then, even if a thickness of the first nitride semiconductor layer 2 underlying is thinned, the surface of the substrate 1 is prevented from being roughened.

As the substrate 1, a zinc oxide based compound such as $Mg_xZn_{1-x}O$ or the like, for example, an n-type ZnO substrate 1, is used. By using such oxide, the substrate can be easily removed by wet etching, one electrode can be taken out from a back surface of the substrate since semiconductor has conductivity, and lattice matching can be easily achieved (a crystal layer for seeds is formed with high quality) because a lattice constant thereof is similar to that of a nitride semiconductor layer above all, thereby, a film can be formed with higher quality than that in a conventional case using a sapphire substrate. In case of forming a light emitting device emitting light with a short wavelength, the substrate 1 may be made of $Mg_xZn_{1-x}O$ ($0 \leq x \leq 0.5$) or the like in which Mg is mixed so as not to absorb the light, in place of being made of ZnO. However, it is not preferable that a concentration of Mg is over 50 at % since MgO is a crystal of a NaCl type which does not match with a ZnO based compound of a hexagonal system in lattice. By the way, the $Mg_xZn_{1-x}O$ substrate is formed by cutting out wafers from an ingot formed by a hydrothermal synthesis method or the like.

Figure 5:
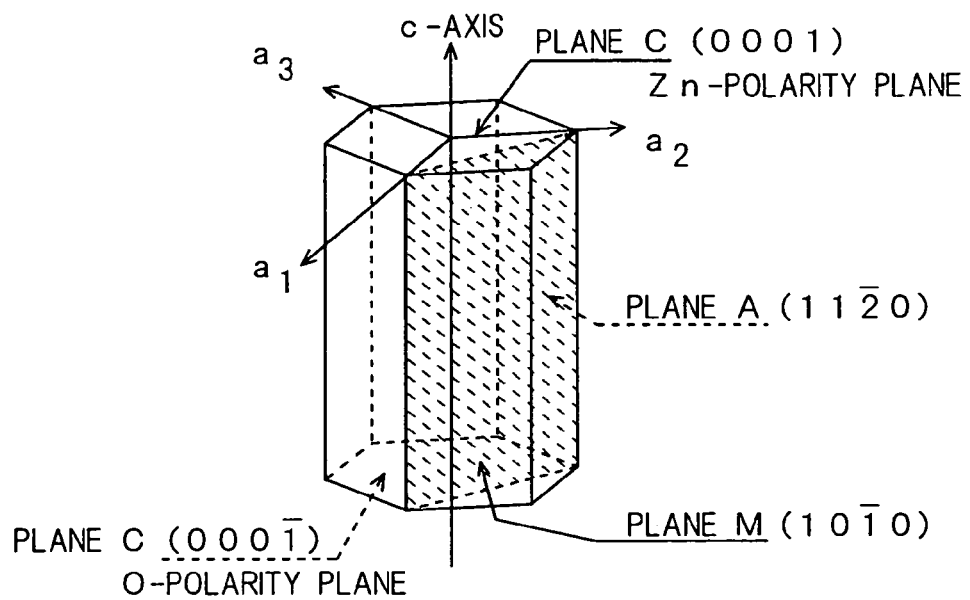
FIG. 5 is a figure for explaining a ZnO crystal structure.

In addition, it is preferable to use a (0001) plane and Zn polarity plane shown in FIG. 5 as a principal plane of the substrate 1, because resistance to ammonia gas is high comparing with a principal plane of an O polarity plane, and a surface of the ZnO substrate 1 is less roughened, however, other planes may be used. Namely, in case of using a C plane as a principal plane of a ZnO substrate, an O polarity plane and a Zn polarity plane exist on the C plane, however, in case of using a Zn polarity plane as the principal plane, Zn appears on a surface, thereby resistance to etching by ammonia gas is higher comparing to the case in which O exists on the surface, and roughness of the surface caused by ammonia gas is lowered comparing to the O polarity plane.

Figure 1B:
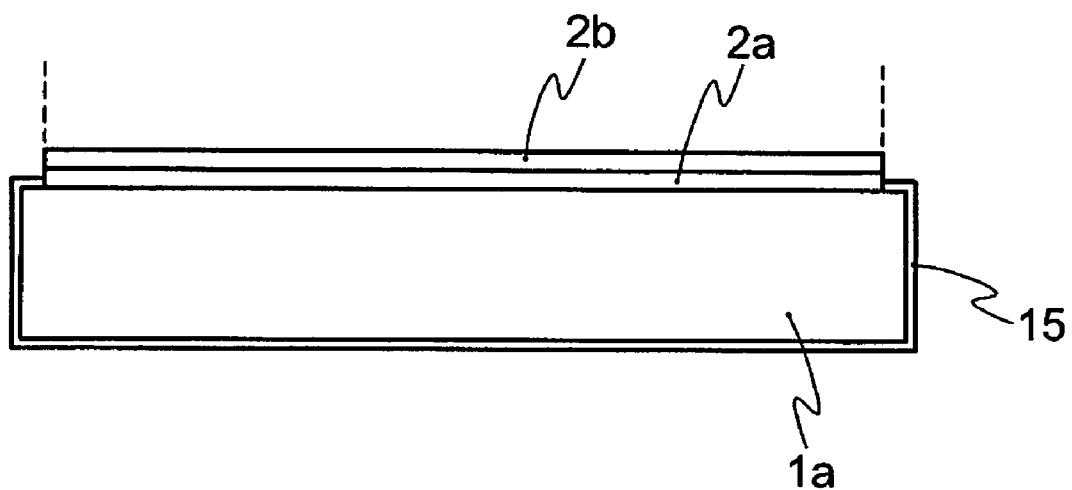
FIG. 1B is a partial sectional view illustrating a protection film formed on the substrate of FIG. 1A.

As described above, since a surface of the substrate 1 is etched by ammonia gas when being exposed to an ammonia atmosphere under a high temperature, the surface is roughened, crystallinity of the substrate itself deteriorates, and, at the same time, crystallinity of nitride semiconductor layers grown thereon deteriorates remarkably. Then, the nitride semiconductor layers are preferably formed by protecting a back surface, side and an end portion of the surface of, for example, a ZnO substrate 1a, by coating with a protection film 15 made of $SiO_2$, $Si_3N_4$, Pt or the like which does not vaporize at a high temperature as shown in FIG. 1B, and setting the ZnO substrate 1a (wafer) on a work carrier of a MOCVD apparatus, made of carbon, molybdenum or the like.

The first nitride semiconductor layer 2 is a layer, which is made of nitride semiconductor having a lattice constant similar to that of the substrate, for inhibiting etching by ammonia gas and, at the same time, for seeds for epitaxial growth in a lateral direction from opening portions of the mask layer 4 described later, and is provided in contact with the substrate. In order to lower activity and absolute quantity of ammonia gas and to prevent the substrate from being etched, it is preferable that the first nitride semiconductor layer 2 is formed, in case of growing by a MOCVD method, at a low temperature of 600 to 800° C. which is lower than a usual growth temperature of a GaN crystal layer, and with setting a molar ratio of a raw material of group V element to that of group III element to 500 or more and 2,000 or less. In addition, in case of forming one electrode on a back surface of the substrate 1, a conductivity type of the first nitride semiconductor layer 2 is required to be the same conductivity type as the substrate 1, however, in case of not forming one electrode on the back surface of the substrate 1, the first nitride semiconductor layer 2 may be formed undoped or doped with Si (n dopant) or the like.

It is preferable that a thickness of the first semiconductor layer 2 is 500 Angstroms or more in order to prevent ammonia gas from transmitting the first nitride semiconductor layer, surely. In addition, as described later, since, by providing a mask layer 4 having opening portions 4a, the ammonia gas can not pass through the mask layer 4 in a region except the opening portions 4a, the thickness of the first nitride semiconductor layer 2 is not required to be so thick, and can be approximately 500 to 8,000, preferably 1,000 to 4,000 Angstroms, concretely. In such manner, since the first nitride semiconductor layer 2 can be formed thin, there can be inhibited a leakage current by occurrence of film separation or cracks caused by stress generated between the first nitride semiconductor layer 2 and the substrate 1.

In addition, an AlGaN based compound which has comparatively small Al concentration is preferably used for the first nitride semiconductor layer. It is because, ammonia gas can be prevented from reaching the substrate and etching the substrate by existence of Al, and even by using a usual growth method (high temperature growth) for forming a semiconductor lamination portion thereafter, nitride semiconductor layers with excellent cryatalinity can be grown. More concretely, if GaN or an InGaN based compound is used for the first nitride semiconductor layer 2, ammonia gas occasionally transmits a layer made of the GaN or the InGaN based compound because In or the like is apt to vaporize, and there arises a case such that a surface of the ZnO substrate underlying is roughened. However, when an AlGaN based compound is used for the first nitride semiconductor layer 2, since the first nitride semiconductor layer 2 contains Al, ammonia gas can be prevented from reaching a surface of the substrate by existence of Al, and, furthermore, since film adhesion strength of a layer made of the AlGaN based compound is stronger comparing to that of a layer made of GaN and the InGaN based compound, film separation hardly occurs.

Therefore, once the first nitride semiconductor layer 2 is formed of AlGaN with an Al concentration and a film thickness of a certain value or more, film separation hardly occurs, and at the time of laminating a semiconductor lamination portion under a high temperature condition thereafter, since ammonia gas does not reach a surface of the ZnO substrate, nitride semiconductor layers with excellent crystallinity can be grown even by using a usual growth method. In addition, since difference of a coefficient of thermal expansion with the substrate is smaller than that in a case of GaN or InGaN, an occurrence probability of leakage current caused by occurrence of cracks can be lowered. And, it is preferable to set Al concentration of the AlGaN based compound to 20% or less and 5% or more. However, as shown in FIG. 1, by forming the first nitride semiconductor layer 2 with a plurality of layers or a gradient layer, a layer made of GaN or an InGaN based compound may be provided at an opposite side of the substrate 1 without any problems, and since the mask layer 4 is provided on the most area of the surface, a single layer made of GaN or an InGaN based compound may be used.

In the example shown in FIG. 1, the first nitride semiconductor layer 2 is formed with a plurality of layers in which a first layer 2a made of an AlGaN based compound is provided at a side of the substrate 1, a second layer 2b made of GaN is formed at a surface side, and a composition of the layer of the surface side is arranged so as to match to that of a layer laminated on the mask layer 4. In this case, the second layer 2b of the surface side of the first nitride semiconductor layer 2 becomes a seed layer for lateral growth.

Figure 2:
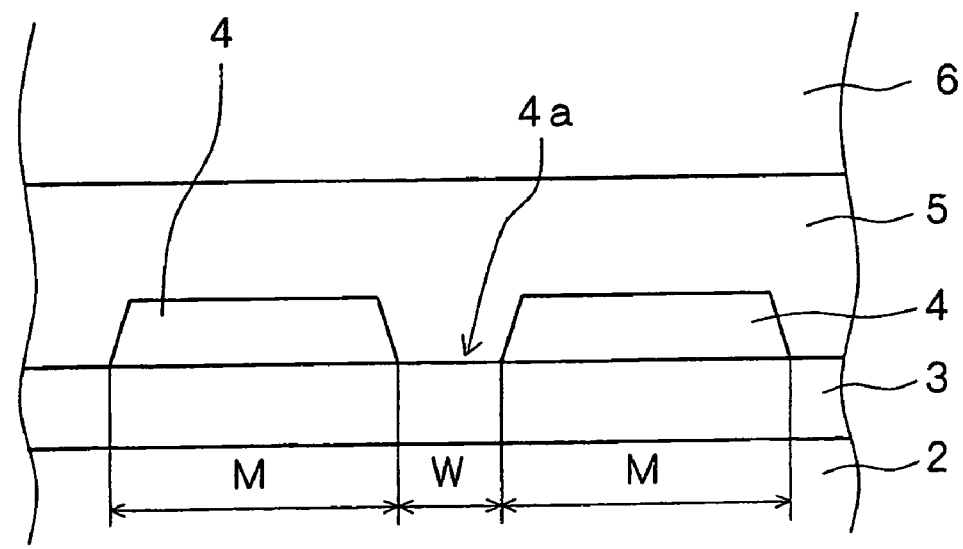
FIG. 2 is an enlarged explanatory cross-sectional view of a vicinity of the mask layer according to the present invention.

The mask layer 4, as an enlarged explanatory figure of the vicinity thereof is shown in FIG. 2, is provided on the first nitride semiconductor layer 2, has opening portions 4a having a width W, and is formed so as to contact directly with the first nitride semiconductor layer 2. The mask layer 4 is formed by depositing a dielectric material or the like such as, for example, $SiO_2$, $Si_3N_4$ or the like, on which a semiconductor layer can not be epitaxially grown directly, by a sputtering or CVD method, with a thickness of approximately 200 to 800 nm. The thickness of 200 nm or more is required for preventing ammonia gas from invading a substrate, and that of 800 nm or less for preventing crystals from deterioration caused by occurrence of level differences.

The mask layer 4 is provided on whole surface of the first nitride semiconductor layer 2 of a wafer state, thereafter the opening portions 4a are formed by patterning (extending with a groove shape in a direction perpendicular to a paper surface of FIG. 1 or 2). A reason why the opening portions are provided is that, the first nitride semiconductor layer 2 exposed at the opening portions 4a acts as seeds, the second nitride semiconductor layer 5 is selectively grown laterally on the mask layer 4, thereby a dislocation density of the second nitride semiconductor layer 5 is lowered. In addition, in order to form a LED of a type in which light is emitted from an upper surface, between the mask layer 4 and the first nitride semiconductor layer 2 at regions except the opening portions, a metal film made of Al, Ag, Au or the like may be provided as a reflection layer.

When a semiconductor light emitting device shown in FIG. 1 is manufactured, a width M of the mask layer is set to 10 to 15 μm in order to achieve laterally selective growth. If an interval W of the mask layer is too large, longitudinal growth in which a dislocation density is large occurs, therefore it is preferably set to 5 μm or less. In addition, if the interval W of the mask layer is too small, it takes long time to grow crystals from the first nitride semiconductor layer 2, therefore it is preferably 2 μm or more.

In addition, in order to make dividing into each device easy, if, as shown in FIG. 1, only a mask layer of a portion (both end portions of an element (chip)) of a region for dividing into each element is spread comparing to other portions, laterally selective growth does not occur surely on the mask layer 4 of the portion of the region for dividing into each element, and the wafer is divided spontaneously by the portion of the region of the mask layer 4 for dividing into each element. Then, the width of the mask layer near the region for dividing into each element is formed wider than that of the mask layer near a center portion of the element, and preferably set concretely to 40 to 80 μm. By such constitution, since each element can be independent before forming the semiconductor lamination portion 9, even if a crack by a stress occurs in one element, spread of the crack to other elements can be inhibited. In addition, even if a stress depending on difference of a coefficient of thermal expansion acts between the substrate 1 and the semiconductor lamination portion, the stress is absorbed in the region for dividing into each device, and a wafer itself can not be bent in an arcuate shape.

The second nitride semiconductor layer 5 is formed with, for example, an n-type GaN layer and with a thickness of approximately 5 to 10 μm. The second nitride semiconductor layer 5 begins to grow using the first GaN layer 2b exposed from the opening portions 4a of the above-described mask layer 4 as seeds, and when it reaches a surface of the mask layer 4, it grows selectively in a lateral direction. Namely, since a GaN layer grows faster and with more excellent crystallinity in a lateral direction than in a longitudinal direction, by growing slightly in a longitudinal direction while growing in a lateral direction, semiconductor layers growing in a lateral direction from both opening portions are joined each other at the vicinity of a center portion of the mask layer 4 at last. Then, after a surface of the mask layer 4 is covered entirely, the semiconductor layer grows in an upper direction and the second n-type GaN layer (semiconductor layer) 5 grows also on the mask layer 4 entirely. The second n-type GaN layer 5 has excellent crystallinity at a region except both end portions (portions in contact with the opening portion 4a) and a joint portion of the center portion on the mask layer, and a dislocation density is low by one order.

The semiconductor lamination portion 9 on the second n-type GaN layer 5 is formed as a semiconductor lamination portion constituting a usual light emitting diode. Namely, in an example shown in FIG. 1, the semiconductor lamination portion 9 is formed by providing an n-type layer 6 made of n-type GaN doped with Si having a thickness of approximately 1 to 10 μm, an active layer 7 made with a MQW structure (multiple quantum well structure formed by laminating 3 to 8 pairs of well layers made of, for example, $In_{0.17}Ga_{0.83}N$ and having a thickness of 1 to 3 nm, and barrier layers made of $In_{0.01}Ga_{0.99}N$ and having a thickness of 10 to 20 nm) of an undoped InGaN based compound and GaN, having a thickness of approximately 0.05 to 0.3 μm in total, and a p-type layer 8 made of GaN doped with Mg having a thickness of approximately 0.2 to 1 μm.

In addition, the semiconductor lamination portion 9 is laminated with a necessary constitution depending on a semiconductor device manufactured, and, also in case of a LED, not being limited to the above-described example, the n-type layer 6 and the p-type layer 8 may be formed in a multi-layer structure provided with a layer (barrier layer) having a large band gap energy at a side of the active layer, or a super lattice structure or a gradient layer may be provided between semiconductor layers having different compositions, or the second nitride semiconductor layer 5 may share with an n-type layer or a p-type layer. In addition, a structure of the active layer 7 may be a bulk structure or a single quantum well (SQW) structure, not limited to the multi quantum well structure. Further, although the example shows a double hetero junction structure formed by holding the active layer 7 with the n-type layer 6 and the p-type layer 8, a hetero junction structure formed by joining an n-type layer and a p-type layer directly may be used. The point is that the n-type layer 6 and the p-type layer 8 are provided so as to form a light emitting layer in case of constituting a LED. In addition, although the above-described example is an example of a LED, a LD can be formed similarly by forming a light emitting region having a stripe shape.

Subsequently, an explanation of a method for manufacturing the light emitting diode will be given below. A wafer, in which a protection film is provided on a region except a growth surface of the ZnO substrate 1 formed with, for example, an n-type conductivity, and with a principal plane of a (0001) plane and Zn polarity plane, is set within a MOCVD apparatus, and the surface of the substrate is cleaned in an hydrogen carrier gas at a raised temperature of 600 to 800° C., for example 700° C. Subsequently, by supplying ammonia gas ($NH_3$) of a raw gas of group V element, and trimethyl gallium (TMG) and trimethyl aluminium (TMA) of group III element, the first layer 2a of a first nitride semiconductor layer 2 made of $Al_yGa_{1-y}N$ ($0.05 \leq y \leq 0.2$, for example y=0.2) is grown with Si doping and with a thickness of 500 Angstroms, for example approximately 2,000 Angstroms, and the second layer 2b made of GaN is grown with Si doping and with a thickness of approximately 2,000 Angstroms. Here, flow rates of the ammonia gas and the carrier gas carrying the raw material of group III element are adjusted so as to set a molar ratio of the raw materials of group V element and group III element to 2,000 or less, for example approximately 500 (the raw material of group V element of $2 \times 10^{-2}$ mole and the raw material of group III element of $4 \times 10^{-5}$ mole). Although the Si doping is necessary for forming an electrode on a back surface of the substrate 1, an undoped substrate may be used in case of not forming an electrode on a back surface of the substrate. It is preferable for preventing the surface of the ZnO substrate from being roughened that an atmosphere within a chamber is made with an atmosphere of a raw material of group III element at first by supplying TMA and TMG of an organic metal of a raw material of group III element for several seconds just before growing the first nitride semiconductor layer 2, thereby the protection film is formed on the surface of the ZnO substrate with the raw material of group III element, thereafter, ammonia of a raw material of group V element is supplied.

And subsequently, the substrate is taken out from the growth apparatus, by using, for example, a sputtering apparatus, a vapor deposition apparatus or the like, a $SiO_2$ film for the mask layer 4 is formed with a thickness of approximately 200 to 800 nm. Thereafter, a resist film is provided thereon and patterned, and the $SiO_2$ film is etched by an aqueous solution of HF, thereby the opening portions 4a are formed with a stripe shape and the mask layer 4 with the stripe shape is formed.

Thereafter, the substrate is set within the MOCVD apparatus or the like, necessary gasses are supplied such as trimethyl indium (TMIn) as a raw material gas for In besides the above-described gas, and cyclopentadienyl magnesium ($Cp_2Mg$) or dimethyl zinc (DMZn) as a p-type dopant, with hydrogen gas as a carrier gas, thereby the second n-type GaN layer 5 and each semiconductor layer of the semiconductor lamination portion 9 are grown with each thickness described above. In this case, since the n-type GaN layer 5 which is the second nitride semiconductor layer 5 is easy to grow laterally when a temperature of the substrate is high, and easy to grow longitudinally when a temperature of the substrate is low, the layer is grown firstly at a temperature of approximately 850 to 1,000° C. and at a temperature of approximately 950 to 1,100° C. after the opening portions are filled, the n-type layer 6 is grown at a temperature of the substrate of approximately 950 to 1,100° C., the active layer 7 is grown at a temperature of the substrate of approximately 700 to 770° C., and each layer after them is grown at a temperature of the substrate of approximately 950 to 1,100° C. again. In addition, in order to change compositions of In or Al of an InGaN based compound or an AlGaN based compound, flow rates of TMIn of a raw material gas of In and TMA of a raw material gas of Al are adjusted.

Thereafter, a light transmitting conductive layer 10, having a thickness of approximately 0.01 to 5 µm, which is made of, for example, ZnO or the like and capable of ohmic contact with the p-type layer 8 is provided on a surface of the semiconductor lamination portion 9. The ZnO is formed in a film so as to have a specific resistance of approximately (3 to 5)$\times 10^{-4}$ Ω·cm by doping Ga. The light transmitting conductive layer 10 is not limited to ZnO, and an ITO film or a thin alloy film of Ni and Au having a thickness of 2 to 100 nm can diffuse electric current to whole of a chip while transmitting light.

Then, after polishing a back surface of the substrate 1 so that a thickness of the substrate 1 is approximately 100 µm, an n-side electrode 12 is formed by laminating Ti/Al or Cr/Pt/Au or Ni/Au or the like on the back surface, further a p-side electrode 11 is formed with a lamination structure made of Ti/Au by a lift off method on a surface of the light transmitting conductive layer 10, and whole of a chip is covered with a SiON film not shown in the figure by a plasma CVD method and an opening portion is formed at an electrode portion. Thereafter, a light emitting device chip having a structure shown in FIG. 1 is formed by dividing a wafer into chips.

Figure 3:
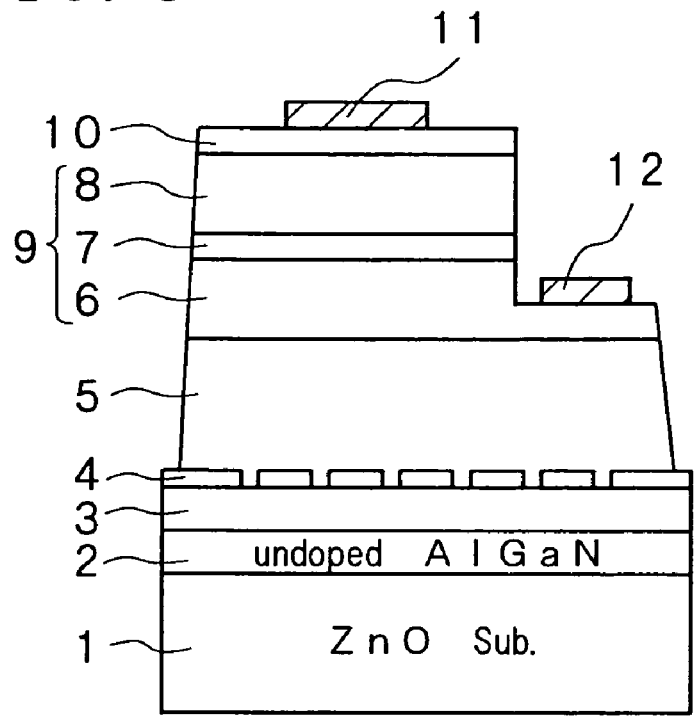
FIG. 3 is an explanatory cross-sectional view of an example which is another structure of the nitride semiconductor device according to the present invention.

According to the present invention, since nitride semiconductor layers are laminated on the ZnO based compound substrate, one electrode can be formed on a back surface of the substrate, and a device of a vertical type can be formed in which a pair of electrodes is formed at upper and lower sides of the chip. However, even in case of using such substrate, the n-side electrode 12 can be formed on the n-type layer 6 exposed by etching a part of the semiconductor lamination portion 9 laminated, by dry etching, as shown in FIG. 3. By using such structure, a device emitting sufficient light can be obtained even if the ZnO substrate 1 or the AlGaN layer 2a or the GaN layer 2b has a high electric resistance. Here, a structure of the semiconductor lamination portion or the like is similar to that of an example shown in FIG. 1, and the same letters and numerals are attached to the same parts and an explanation is omitted.

Figure 4:
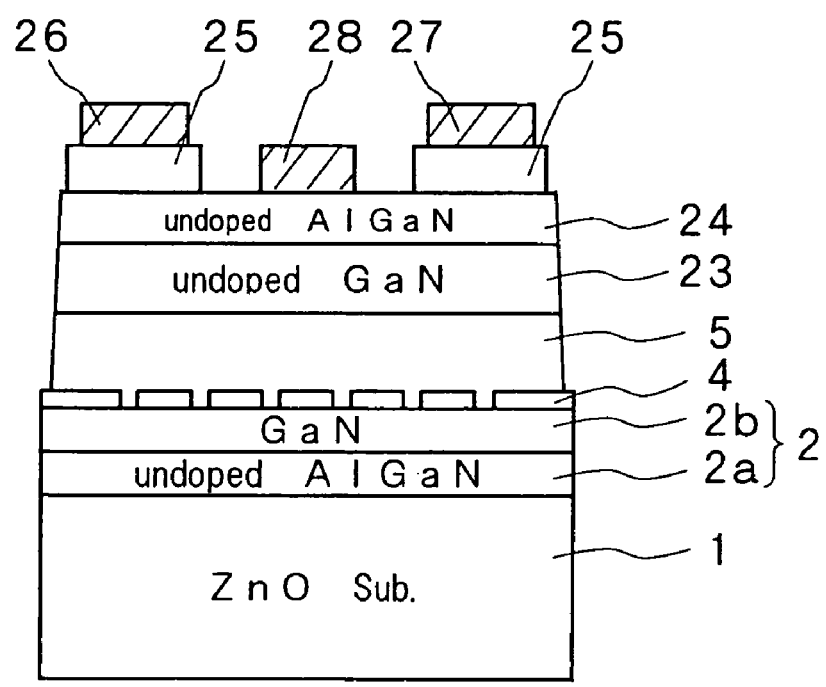
FIG. 4 is an explanatory cross-sectional view of a constitution of the transistor formed by the present invention.

FIG. 4 is an explanatory cross-sectional view showing a transistor constituted by laminating nitride semiconductor layers with excellent crystallinity by forming a first nitride semiconductor layer 2 made of an AlGaN based compound on a surface of the above described ZnO substrate 1 and a mask layer 4 having opening portions. In a same condition as a case of the light emitting device, by using a MOCVD apparatus, after growing firstly the first layer 2a made of undoped AlGaN and the second layer 2b made of undoped GaN, of the first nitride semiconductor layer 2, the mask layer 4 is formed, and the opening portions are provided. Subsequently, necessary organic metal gasses are supplied in the same manner described above, there are formed, in order, the second nitride semiconductor layer 5 made of undoped GaN, an undoped GaN layer 23 approximately 4 µm thick, an electron transit layer 24 made of undoped AlGaN based compound approximately 10 nm thick, an n-type GaN layer 25 approximately 5 nm thick, and the electron transit layer 24 is exposed by etching and removing a part of the n-type GaN layer 25 so as to provide a predetermined interval of approximately 1.5 µm to be a gate length. And a transistor is constituted by forming a source electrode 26 and a drain electrode 27 made with, for example, a Ti film and a Au film on the n-type GaN layer left with the predetermined interval, and a gate electrode 28 formed by laminating, for example, a Pt film and a Au film on a surface of the un-doped AlGaN based compound layer 24. The nitride semiconductor layers with excellent crystallinity can be formed and a transistor (HEMT) with a small leakage current and a high withstand voltage can be obtained by forming the nitride semiconductor layer 2 and the mask layer 4 having the opening portions, on a surface of the substrate, and by growing the second nitride semiconductor layer 5 thereon.

As described above, according to the present invention using the ZnO based compound, since, while using a zinc oxide based compound such as ZnO or the like for the substrate, the first nitride semiconductor layer which has a similar lattice constant to that of the substrate and a property of not transmitting ammonia gas, and the mask layer having opening portions are provided on a surface of the substrate in order to laminate nitride semiconductor layers, etching the substrate by ammonia gas does not occur and forming the semiconductor lamination portion can be carried out at a high temperature, thereby a nitride semiconductor device with excellent crystallinity can be formed. As a result, there can be significantly improved characteristics of a device using nitride semiconductor such as a nitride semiconductor light emitting device such as a LED, a LD (laser diode) or the like with excellent light emitting characteristics, a nitride transistor such as a HEMT or the like with a small leakage current and a high withstand voltage, or the like.

Figure 6:
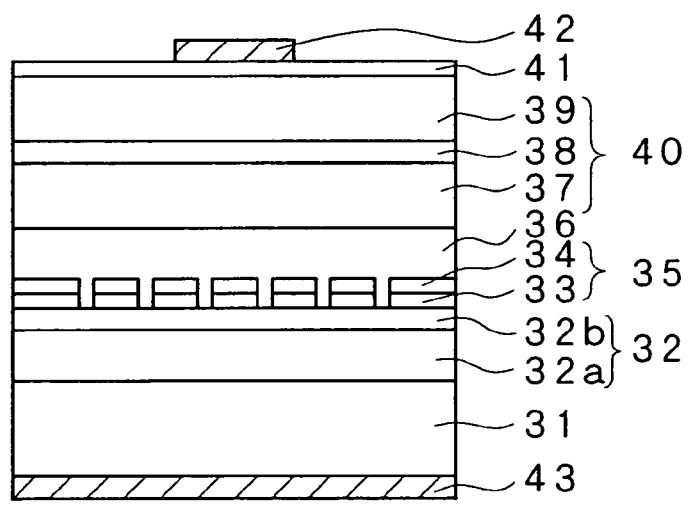
FIG. 6 is an explanatory cross-sectional view of a LED which is another embodiment of the nitride semiconductor device according to the present invention.
Figure 9:
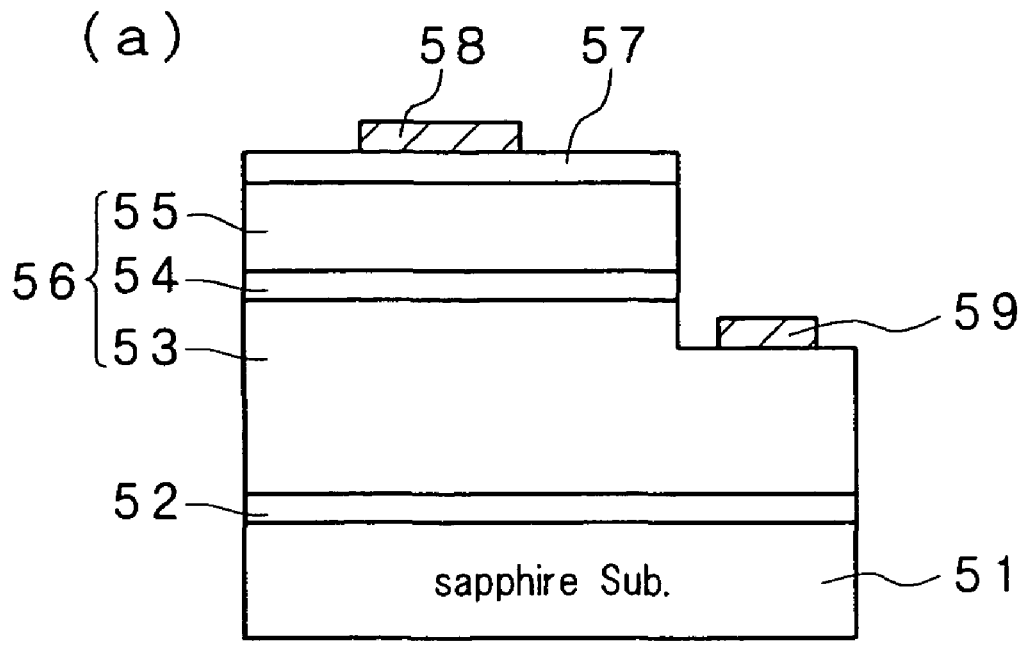
FIG. 9 is figures of examples of constitutions of LEDs using conventional nitride semiconductor.
Figure 9:
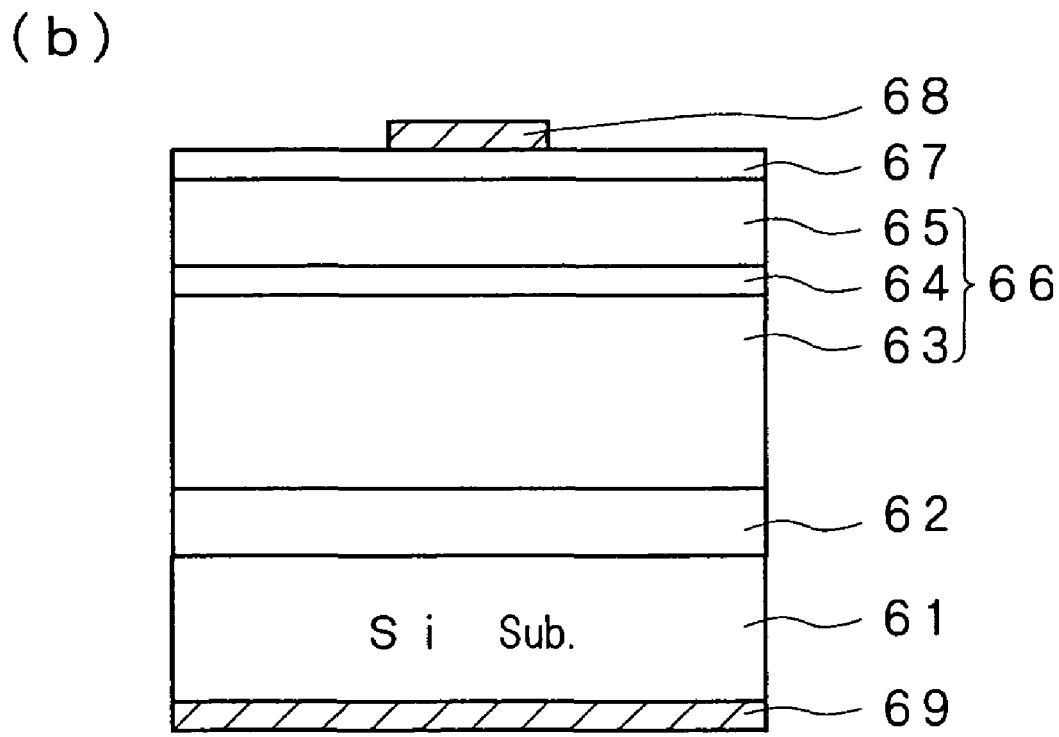

Subsequently, an explanation of a nitride semiconductor light emitting device according to the present invention in which a conductive semiconductor substrate such as Si or the like is used as a substrate in place of the ZnO based compound will given below. As an explanatory cross-sectional view of a nitride semiconductor light emitting device (LED chip) of an embodiment is shown in FIG. 6, the nitride semiconductor light emitting device according to this embodiment is formed by providing a first nitride semiconductor layer 32 on a semiconductor substrate 31, a mask layer 35 having opening portions thereon, and a second nitride semiconductor layer 36 selectively grown laterally on the mask layer 35 from the opening portions and, a semiconductor lamination portion 40 formed by laminating nitride semiconductor layers so as to form a light emitting layer 38. Here, the mask layer 35 is composed of a metal film 33 provided at a side of the first nitride semiconductor layer 32 and a dielectric film 34 provided on the metal film 33.

Namely, this embodiment is characterized in forming the mask layer 35 with the metal film 33 which reflects light traveling to the substrate side, and the insulating film 34 on which the nitride semiconductor layer can be selectively grown laterally, besides using a semiconductor substrate, which is conductive, capable of forming an electrode on a back surface thereof, and high in thermal conductivity. As described above, if a sapphire substrate is used, since it is an insulating substrate, an electrode can not be formed on a back surface of the substrate and a mesa structure is required to be used, and since thermal conductivity of the sapphire substrate is low, thermal saturation occurs at high temperature and high output operation, and light emitting efficiency can not be enhanced. On the other hand, in order to prevent the above-described problem, if a substrate made of GaAs, GaP, SiC, Si or the like which is a conductive substrate is used, since the substrate is made electric conductive by doping, it is not necessary to form a mesa structure and a vertical type device in which a pair of electrodes is formed on upper and lower surfaces of a chip can be formed, and since thermal conductivity of the substrate is high, light emitting efficiency can be prevented from lowering at high temperature operation. However, a dislocation density caused by lattice mismatching between the substrate and a nitride semiconductor layer increases and absorption of light at the substrate occurs, thereby there arises a problem such that the light emitting efficiency lowers.

However, according to the present invention, for increase of a dislocation density caused by lattice mismatching, since the mask layer 35 having opening portions is used, and the second nitride semiconductor layer 36 is grown by laterally selective growth using the first nitride semiconductor layer 32 exposed from the opening portions as seeds, dislocations generated at the substrate side is prevented from penetrating to upper layers by the mask layer 35. Therefore, a density of penetrating dislocations becomes very small and a nitride semiconductor layer with excellent crystallinity can be obtained. As a result, in a semiconductor lamination portion laminated thereon, since layers with excellent crystallinity can be formed, even if a lattice-mismatched substrate is used, a dislocation density can be lowered comparing to the conventional case. In addition, as for the problem such that light is absorbed at the substrate, since the metal film 33 is formed under the insulating film 34, light generated in the light emitting layer 38 and traveling to the substrate 31 is reflected by the metal film 33, and prevented from entering the substrate 31, thereby the light absorption at the substrate 31 can be inhibited.

In an example shown in FIG. 6, an n-type Si substrate is used as the semiconductor substrate 31, however it is not limited to Si, and SiC, GaAs, GaP or the like may be used. In case such that light such as blue or ultraviolet light emitted in nitride semiconductor layers is absorbed by the substrate, the present invention is specially effective. Since the semiconductor substrate can be made conductive by doping, one electrode can be taken out from a back surface of the substrate. In addition, if any of the above-described materials is used, a lattice constant thereof does not match with that of GaN, and lattice matching can not be obtained, however, by laterally selective growth of the GaN layer through the mask layer 35 as described above, the second nitride semiconductor layer 36 with a small dislocation density can be grown on the mask layer 35. In an example described below, an example of an n-type substrate is explained, however a p-type substrate may be used.

The first nitride semiconductor layer 32 is formed with, for example, an AlGaN based compound layer 32a grown at a low temperature and a GaN layer 32b grown at a high temperature which are approximately 3 μm thick and doped in an n-type, by a usual epitaxial growth method such as a MOCVD method or the like, and it is a layer for relaxation of lattice mismatching and for seeds at the time of forming the second nitride semiconductor layer 36 by laterally selective growth. Now, in the example shown in FIG. 6, the first nitride semiconductor layer 32 has a two layer structure in which the AlGaN based compound layer 32a is a lattice mismatching relaxation layer and the GaN layer 32b is a crystal layer for seeds, however, these layers may have a single layer or a super lattice structure. In addition, a composition may only be a nitride semiconductor layer such as an InGaN based compound or the like besides an AlGaN based compound and GaN, depending difference of lattice constants of the substrate used and semiconductor layers laminated thereon, and a thickness of the film is set according to requirements.

The mask layer 35(351), as an enlarged explanatory figure of the vicinity thereof is shown in FIG. 7, is provided on the first nitride semiconductor layer 32, and composed of the metal film 33 having opening portions 353 with a width W and provided at the first nitride semiconductor 32 side, and the insulating film 34 provided on the metal film 33.

For the metal film 33, a metal having a large reflection coefficient to light of a blue to ultraviolet region such as, for example, Al, Ag, Au or the like is preferable. In addition, it is preferable, as shown in FIG. 7, to form the metal film 33 with, at least, a two layer structure of a first metal layer 33a provided at the first nitride semiconductor layer 32 side and a second metal layer 33b provided on the first metal layer 33a, and form the second metal film 33b of the above-described material and the first metal film 33a of a metal having a melting point higher than a growth temperature of a semiconductor lamination portion 40, because a material of the second metal film 33b does not make an alloy with semiconductor layer and diffusion thereof can be inhibited. For example, W, Ti, Pd or the like is preferably used for the first metal film 33a. It is most suitable to form the first metal film 33a with a thickness of 10 to 200 nm and the second metal film with a thickness of 10 to 200 nm.

The insulating layer 34 is formed with a thickness of approximately 200 nm by a sputtering method or the like by depositing an insulating material such as, for example, $SiO_2$, $Si_3N_4$ or the like, on which a semiconductor layer can not be directly grown epitaxially. The insulating layer 34 is for not growing the second nitride semiconductor layer 36 directly on the first nitride semiconductor layer 32, and if the film is formed so as to maintain a mask function, a thickness of the film is preferably thinner because a level difference does not occur.

The metal film 33 and the insulating layer 34 are provided on a whole surface of the first nitride semiconductor layer 32 of a wafer stage sequentially, thereafter opening portions 353 with a groove shape (groove extending in a perpendicular direction to the paper surface in FIG. 7) are formed by patterning. The reason why the opening portions 353 are provided is, as described later, to grow the second nitride semiconductor layer 36 by laterally selective growth using the first nitride semiconductor layer 32 exposed at the opening portion 353 as seeds, and to lower a dislocation density of the second nitride semiconductor layer 36.

In case of manufacturing a semiconductor light emitting device shown in FIG. 6, a width M1 (cf. FIG. 8) of the mask layer is formed approximately 10 to 15 μm wide in order to realize laterally selective growth. Since, when an interval W of the mask layer is too wide, a longitudinal growth with a large penetrating dislocation density occurs and a laterally selective growth with small dislocation density does not advance, and also in order to increase an area of a region reflecting light generated in a light emitting layer, it is preferable that the interval is 5 μm or less. In addition, since, when the interval W of the mask layer is too small, it takes long time to grow crystals from the seeds of the first nitride semiconductor layer 32, the interval is preferably 2 μm or more.

In addition, as shown in an explanatory cross-sectional figure before dividing into devices in FIG. 8, in order to make it easy to divide into devices, and prevent a wafer from bending depending on difference of coefficients of thermal expansion between the Si substrate 31 and the nitride semiconductor lamination portion 40 at a wafer stage, if only a mask layer 352 corresponding to an element dividing region 45 (both end portions of a chip when divided into elements (chips)) is widened, a mask width M2 of the element dividing region is wider than a mask width M1 of the mask layer 351 within the element, the laterally selective growth does not occur perfectly on the mask layer 352, and elements are divided spontaneously by the mask layer 352. Then, it is preferable to form the width M2 of the mask layer 352 in the vicinity of the element dividing region 45 wider than the mask width M1 of the mask layer 351 in the center portion of the element, and set concretely approximately 20 to 80 μm. In such manner, by widening the width M2 of the mask layer 352 of the element dividing region 45, even if difference of a coefficient of thermal expansion between the Si substrate 31 and the nitride semiconductor layers is large, strain caused by the difference of a coefficient of thermal expansion can be absorbed and the substrate can be prevented from bending or the like. In addition, since each element can be independent, a process of dividing a wafer into chips becomes easy.

The second nitride semiconductor layer 36 is formed, for example, with an n-type GaN layer with a thickness of approximately 5 to 10 μm. The semiconductor layer 36 begins to grow using the first GaN layer 32b exposed from opening portions 353 of the above-described mask layer 35 as seeds, and grows selectively in a lateral direction after the growing GaN layer reaches a surface of the mask layer 35. Namely, since the GaN layer grows faster and better in crystallinity in a lateral direction than in a longitudinal direction, it grows slightly in the longitudinal direction while growing in the lateral direction, and the semiconductor layers grown in the lateral direction from two opening portions join each other at the vicinity of a center portion of the mask layer 35. Then, after a surface of the mask layer 35 is covered perfectly, the GaN layer grows upward, and the second n-type GaN layer (semiconductor layer) 36 is also grown wholly on the mask layer 35. The second n-type GaN layer 36 has excellent crystallinity and a smaller dislocation density by one order at a region except both end portions (portions in contact with the opening portions 353) above the mask layer 35, and a center portion where the GaN layers join.

The semiconductor lamination portion 40 on the second n-type GaN layer 36 is a semiconductor lamination portion constituting a usual light emitting diode. Namely, the semiconductor lamination portion in an example shown in FIG. 6 is formed by providing an n-type layer 37 made of n-type GaN doped with Si having a thickness of approximately 1 to 10 μm, an active layer 38 made with a MQW structure (multiple quantum well structure formed by laminating 3 to 8 pairs of well layers made of, for example, $In_{0.17}Ga_{0.83}N$ and having a thickness of 1 to 3 nm, and barrier layers made of $In_{0.01}Ga_{0.99}N$ and having a thickness of 10 to 20 nm) of an undoped InGaN based compound, having a thickness of approximately 0.05 to 0.3 μm in total, and a p-type layer 39 made of GaN doped with Mg having a thickness of approximately 0.2 to 1 μm.

In addition, the semiconductor lamination portion 40 is laminated with a necessary constitution depending on a semiconductor device manufactured, and in case of a LED, not being limited to the above-described example, the n-type layer 37 and the p-type layer 39 may be formed in a multi-layer structure provided with a layer (barrier layer) having a large band gap energy at an active layer side, or a super lattice structure or a gradient layer may be provided between semiconductor layers having different compositions, and the second nitride semiconductor layer 36 may share with an n-type layer or a p-type layer. In addition, a structure of the active layer 38 may be a bulk structure or a single quantum well (SQW) structure, not limited to the multi quantum well structure. Further, although the example shows a double hetero junction structure formed by holding the active layer 38 with the n-type layer 37 and the p-type layer 39, a hetero junction structure formed by joining an n-type layer and a p-type layer directly may be used. The point is that the n-type layer 37 and the p-type layer 39 are provided so as to form a light emitting layer in case of constituting a LED. In addition, although the above-described example is an example of a LED, even in case of a LD, if a structure of a semiconductor lamination portion is formed with a lamination structure for the LD, the LD with excellent crystallinity and small leakage current can be obtained.

Subsequently, an explanation of a method for manufacturing the light emitting diode will be given below. For example, by using a MOCVD apparatus or the like, thermal cleaning is carried out in a $H_2$ atmosphere by raising a temperature of a substrate to approximately 1,100° C. Subsequently, a temperature of the substrate is lowered to approximately 400 to 500° C., and by supplying ammonia gas ($NH_3$) of a raw gas of group V element, trimethyl gallium (TMG) and trimethyl aluminium (TMA) of organic metals of a raw material of group III element, and $SiH_4$ as an n-type dopant, the first $Al_{0.05}Ga_{0.95}N$ layer 32a of an n-type doped with Si is formed with a thickness of approximately 0.01 to 0.05 μm, and the GaN layer 32b is formed with a thickness of approximately 1 to 3 μm by raising a temperature of the substrate to approximately 900 to 1,100° C.

And subsequently, the substrate is taken out from the growth apparatus, and by using, for example, a sputtering apparatus or a vapor deposition apparatus, a Ti film with a thickness of approximately 10 to 200 nm, a Ag film with a thickness of approximately 10 to 200 nm, and a SiO$_2$ film with a thickness of approximately 200 to 500 nm, are formed sequentially. Thereafter, a resist film is provided on the SiO$_2$ film and patterned, and by etching the SiO$_2$ film by an aqueous solution of HF, the Ag film by an aqueous solution of HCl+HNO$_3$, and the Ti film by an aqueous solution of HF, opening portions are formed in a stripe shape and the mask layer 33 with the stripe shape is formed.

Thereafter, the substrate is set within a MOCVD apparatus or the like, necessary gasses are supplied such as trimethyl indium (TMIn) as a raw material gas for In besides the above-described gas, and biscyclopentadienyl magnesium (Cp$_2$Mg) or dimethyl zinc (DMZn) as a p-type dopant, together with hydrogen gas as a carrier gas, thereby the second n-type GaN layer 36 and each semiconductor layer of the semiconductor lamination portion 40 are grown with each thickness described above. In this case, since the n-type GaN layer 36 is easy to grow laterally when a temperature of the substrate is high, and easy to grow longitudinally when a temperature of the substrate is low, the layer is grown firstly at a temperature of approximately 850 to 1,000° C. and at a temperature of approximately 950 to 1,100° C. after the opening portions are filled, the n-type layer 37 is grown at a temperature of the substrate of approximately 950 to 1,100° C., the active layer 38 is grown at a temperature of the substrate of approximately 700 to 770° C., and each layer thereafter is grown at a temperature of the substrate of approximately 950 to 1,100° C. again. In addition, in order to change compositions of In or Al of an InGaN based compound or an AlGaN based compound, the flow rate of TMIn of a raw material gas of In or TMA of a raw material gas of Al is adjusted.

Thereafter, a light transmitting conductive layer 41, having a thickness of approximately 0.01 to 5 μm, which is made of, for example, ZnO or the like and capable of ohmic contact with the p-type layer 39 is provided on a surface of the semiconductor lamination portion 40. The ZnO is formed in a film so as to have a specific resistance of approximately (3 to 5)×10$^{-4}$ Ω·cm by doping Ga. The light transmitting conductive layer 41 is not limited to ZnO, and an ITO film or a thin alloy film of Ni and Au having a thickness of 2 to 100 nm can diffuse electric current to whole of a chip while transmitting light.

Then, after polishing a back surface of the substrate 31 so that a thickness of the substrate 31 is approximately 100 μm, an n-side electrode 43 is formed by laminating Ti/Al or Cr/Pt/Au or Ni/Au or the like on the back surface, further a p-side electrode 42 is formed with a lamination structure made of Ti/Au by a lift off method on a surface of the light transmitting conductive layer 41, and whole of a chip is covered with a SiON film not shown in the figure by a plasma CVD method and an opening portion is formed at an electrode portion. Thereafter, a light emitting device chip having a structure shown in FIG. 6 is formed by dividing a wafer into chips.

According to the present invention, since nitride semiconductor layers are laminated on a semiconductor substrate, one electrode can be formed on a back surface of the substrate, and a device of a vertical type can be formed in which a pair of electrodes is formed at upper and lower sides of a chip. However, even in case of using such substrate, the n-side electrode 43 can be formed on the n-type layer 37 exposed by etching a part of the semiconductor lamination portion 40 laminated, by dry etching. It is the effect of applying the present invention that, even by this structure, since a coefficient of thermal conductivity of the substrate is higher than that of a usual sapphire substrate, a device in which deterioration of light emitting efficiency does not occur up to a high temperature and high output operation can be obtained.

INDUSTRIAL APPLICABILITY

Characteristics of a light emitting device using nitride semiconductor, such as a LED or a laser diode, and a transistor device such as a HEMT can be improved, and the nitride semiconductor device can be used in every kinds of electronic apparatus using the nitride semiconductor device.

What is claimed is:

1. A nitride semiconductor device, comprising:
    a substrate made of a zinc oxide-based compound;
    a first nitride semiconductor layer provided on the substrate;
    a mask layer having opening portions, provided on the first nitride semiconductor layer;
    a second nitride semiconductor layer selectively grown on the mask layer laterally from the opening portions; and
    a semiconductor lamination portion formed by laminating nitride semiconductor layers so as to form a semiconductor element on the second nitride semiconductor layer,
    wherein a principal plane of the substrate is a (0001) plane and Zn polarity plane.

2. The nitride semiconductor device according to claim 1, wherein the
    first nitride semiconductor layer is in contact with the substrate so that the first nitride semiconductor layer has a substrate side,
    and at least said substrate side is made up of Al$_y$Ga$_{1-y}$N (0.05≦y≦0.2).

3. The nitride semiconductor device according to claim 2, wherein a protection film is formed on a back surface and sides of the substrate.

4. The nitride semiconductor device according to claim 2, wherein the first nitride semiconductor layer is formed with a thickness of 500 to 8,000 Angstroms, at a temperature of 600 to 800° C. by a MOCVD method.

5. The nitride semiconductor device according to claim 2, wherein the first nitride semiconductor layer has an opposite side that is opposite to the substrate, and wherein the opposite side is formed with a GaN layer or an InGaN-based compound layer.

6. The nitride semiconductor device according to claim 2, wherein the mask layer is formed with a thickness of 200 to 800 nm.

7. The nitride semiconductor device according to claim 2, wherein portions formed by being separated by the opening portions in the mask layer have widths that are wider at both ends of the nitride semiconductor device than widths of portions inside of the nitride semiconductor device.

8. The nitride semiconductor device according to claim 2, wherein an n-type layer, an active layer and a p-type layer are laminated on the second nitride semiconductor layer so as to form a light emitting layer, thereby forming a semiconductor light emitting device.

9. A nitride semiconductor light emitting device comprising:
    a semiconductor substrate;
    a first nitride semiconductor layer provided on the semiconductor substrate;

a mask layer having opening portions, provided on the first nitride semiconductor layer;

a second nitride semiconductor layer selectively grown on the mask layer laterally from the opening portions; and a semiconductor lamination portion formed by laminating nitride semiconductor layers so as to form a light emitting layer on the second nitride semiconductor layer, wherein the mask layer comprises a metal film provided on the first nitride semiconductor layer and an insulating film provided on the metal film.

10. The nitride semiconductor light emitting device according to claim 9, wherein the metal film is formed with at least double layer structure of a first metal film provided on the first nitride semiconductor layer and a second metal film provided on the first metal film, and the first metal film is made of a metal which has a melting temperature higher than a growth temperature of the semiconductor lamination portion and the second metal film is made of a metal which reflects light emitted in the light emitting layer.

11. The nitride semiconductor light emitting device according to claim 10, wherein the first metal film is made of at least one of W, Ti and Pd, and the second metal film is made of at least one of Al, Ag and Au.

12. The nitride semiconductor light emitting device according to claim 9, wherein the first nitride semiconductor layer comprises a lattice mismatching relaxation layer provided at the substrate side and crystal layer which acts as seeds for the second nitride semiconductor layer, provided on a surface of an opposite side to the substrate.

13. The nitride semiconductor light emitting device according to claim 9, wherein widths of portions formed by being separated by the opening portions in the mask layer are wider at both ends of the device than widths of portions inside of the device.

* * * * *